United States Patent [19]
Sze et al.

[11] Patent Number: 6,110,809
[45] Date of Patent: Aug. 29, 2000

[54] METHOD FOR MANUFACTURING AN EPITAXIAL WAFER WITH A GROUP III METAL NITRIDE EPITAXIAL LAYER

[76] Inventors: Simon M. Sze; Shih-Hsiung Chan; Jian-Shihn Tsang; Jan-Dar Guo; Wei-Chi Lai, all of 1001-1 Ta Hsueh Road, Hsinchu 30050, Taiwan

[21] Appl. No.: 09/102,675

[22] Filed: Jun. 23, 1998

[30] Foreign Application Priority Data

Mar. 26, 1998 [TW] Taiwan ................................. 87104571

[51] Int. Cl.$^7$ ...................................................... H01L 21/20
[52] U.S. Cl. ........................... 438/503; 438/478; 117/952
[58] Field of Search ..................................... 117/950, 951, 117/952; 148/33, 33.4; 438/478, 492, 503, 507, 931, 977

[56] References Cited

U.S. PATENT DOCUMENTS 4,144,116  3/1979  Jacob et al. .

FOREIGN PATENT DOCUMENTS 2304400  11/1976  France .
57-062526  4/1982  Japan .

OTHER PUBLICATIONS

Lee et al., "Vapor phase epitaxy of GaN using GaCl3/N2", Journal of Crystal Growth, vol. 169, pp. 689–696, Dec. 1996.

Topf et al., "Low-pressure chemical vapor deposition of GaN epitaxial films", Journal of Crystal Growth, vol. 189–190, pp. 330–334, Jun. 1998.

*Primary Examiner*—Charles Bowers
*Assistant Examiner*—Keith Christianson
*Attorney, Agent, or Firm*—Merchant & Gould P.C.

[57] ABSTRACT

A new method for manufacturing a Group III metal nitride epitaxial wafer comprises providing a first nitrogen-contained gas source, providing a second Group III metal trichloride—containing gas source, and causing said first gas to react with second gas in a heating region, thereby forming a Group III metal nitride epitaxial layer on a substrate. The formed epitaxial wafer can serve as a substrate of a laser diode.

19 Claims, 3 Drawing Sheets

METHOD FOR MANUFACTURING AN EPITAXIAL WAFER WITH A GROUP III METAL NITRIDE EPITAXIAL LAYER

BACKGROUND OF THE INVENTION

1. Field of the Invention

The invention relates to a method for manufacturing an epitaxial wafer, and in particular, relates to a Group III metal nitride epitaxial wafer serving as a laser diode substrate.

2. Description of the Related Art

In recent years, the research into Group III and V nitrides has drawn much attention. Especially, after Nichia Chemical Corporation in Japan claimed in 1993 that high-brightness blue light emitting diodes would be mass produced, most related studies have focused on the research of light emitting diodes. While there have been some breakthroughs regarding laser diodes, no substrates have been found having a lattice constant that matches that of the active layer, thereby reducing a defect density. Therefore, finding a suitable substrate represents a bottle neck for the growth of laser diodes.

Generally, the defect density of a gallium nitride layer formed on a sapphire substrate is about $10^7$–$10^{10}$ cm$^{-2}$. These materials have a lattice mismatch that is as great as 14%. This prevents gallium nitride from being used as an active layer of a laser diode. Although gallium nitride laser diodes have been developed, their lifetimes are too short.

Consequently, there is still room for improvement. Thus, how to find lattice-matching substrates is an important subject of research. In addition to single crystal sapphire ($Al_2O_3$) substrates, silicon carbide substrates are also considered as an alternative choice. However, silicon carbide is expensive, and is not suitable for mass production. Furthermore, since the lattice mismatch between silicon carbide and gallium nitride is 3.5%, complete lattice matching can not be attained. Therefore, a need remains for substrates that have a better lattice matching with Group III metal nitride and are easily obtained.

One possible solution could be to directly manufacture gallium nitride substrates instead of finding hetero-epitaxial substrates. Unfortunately, the saturated vapor pressure of nitrogen in gallium nitride is too high. It is not easy to manufacture single crystal gallium nitride by pulling a single crystal. Moreover, the temperature needed to grow single crystal gallium nitride is over 1800° C. The pressure required during growing is 20 thousand atmospheres in order to keep nitrogen inside the single crystal gallium nitride. Therefore, it is not an appropriate method for growing the crystal.

In 1990, gallium nitride single crystal was grown on sapphire substrates by using a traditional HVPE method by Nagoya University in Japan. However, the surface of the formed gallium nitride was not really flat, and the characteristics of the gallium nitride were not improved. For improving the surface of the single crystal gallium nitride, a method similar to that of growing a gallium nitride epitaxial layer on a sapphire substrate by an MOCVD technique is adopted. In this method, zinc oxide is first sputtered on a sapphire substrate, serving as a buffer layer. After that, single crystal gallium nitride is formed by an HVPE method. However, the resulting improvements still fall short of expectations.

In growing gallium nitride (GaN) by an HVPE method, hydrogen chloride (HCl) first passes through the surface of gallium having a high temperature of over 800° C., thereby forming a vapor of gallium chloride (GaCl). Then, the gallium chloride reacts with ammonia ($NH_3$) at a temperature of 1000–1200° C. to form gallium nitride which is then deposited on the substrate to form a gallium nitride epitaxial layer. The reaction equation is given as follows:

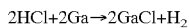

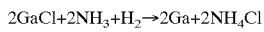

The above-mentioned method for manufacturing an epitaxial wafer according to the prior art has the following disadvantages:

1. In addition to the white ammonium chloride ($NH_4Cl$) powder created from the reaction of gallium chloride and ammonia, excessive or non-reaction hydrogen chloride and ammonia can create a large amount of additional ammonium chloride ($NH_4Cl$) powder. This can affect the surface flatness of the gallium nitride epitaxial layer. Further, the lifetime of the air pumping system can be shortened due to the large amount of powder.
2. Hydrogen chloride is a toxic gas with high corrosion. Human bodies can be harmed upon exposure to only 5 ppm of hydrogen chloride. Also, there can be a strong corrosive action to the system.

As described above, prior art methods cannot provide a perfect Group III metal nitride epitaxial wafer. So, a new method to overcome the above-mentioned problems and efficiently provide a perfect Group III metal nitride chip is expected by industries.

SUMMARY OF THE INVENTION

The present invention discloses a method of manufacturing Group III metal nitrides by reacting Group III metal with a nitrogen-containing gas. By eliminating the use of toxic hydrogen chloride gas, the environmental conservation problems caused by hydrogen chloride are overcome. Further, the ammonium chloride ($NH_4Cl$) created before forming the Group III metal nitride can also be avoided, thereby forming an epitaxial layer with a perfect quality. In the method according to the invention, it is not important if the substrate has a lattice constant that matches that of the Group III metal nitride. Therefore, various easily attainable substrates, such as sapphire ($Al_2O_3$), silicon carbide (SiC), silicon (Si), gallium arsenide (GaAs), gallium phosphide (GaP), gallium nitride (GaN) and aluminum gallium nitride (AlGaN) substrates, can be selected.

Furthermore, in the method of the invention, before depositing an epitaxial layer, a buffer layer may be formed on a substrate. In addition, since a Group III metal nitride epitaxial layer with a large thickness can be readily deposited according to the method of the present invention, the substrate or/and the buffer layer can be stripped off to form a complete Group III metal nitride substrate after forming the epitaxial layer.

The epitaxial layer formed by the method according to the invention is not limited to a 2-element compound composed of a specific Group III metal and nitrogen. Instead, it can also be a 2-element compound such as gallium nitride (GaN), aluminum nitride (AlN) or indium nitride (InN). Moreover, it can also be a 3-element or 4-element compound composed of the above-mentioned 2-element compounds in a specific proportion.

BRIEF DESCRIPTION OF THE DRAWINGS

The invention will become more fully understood from the detailed description given hereinbelow and the accompanying drawings which are given by way of illustration only, and thus are not limitative of the present invention.

DETAILED DESCRIPTION OF THE EMBODIMENT

Figure 1:
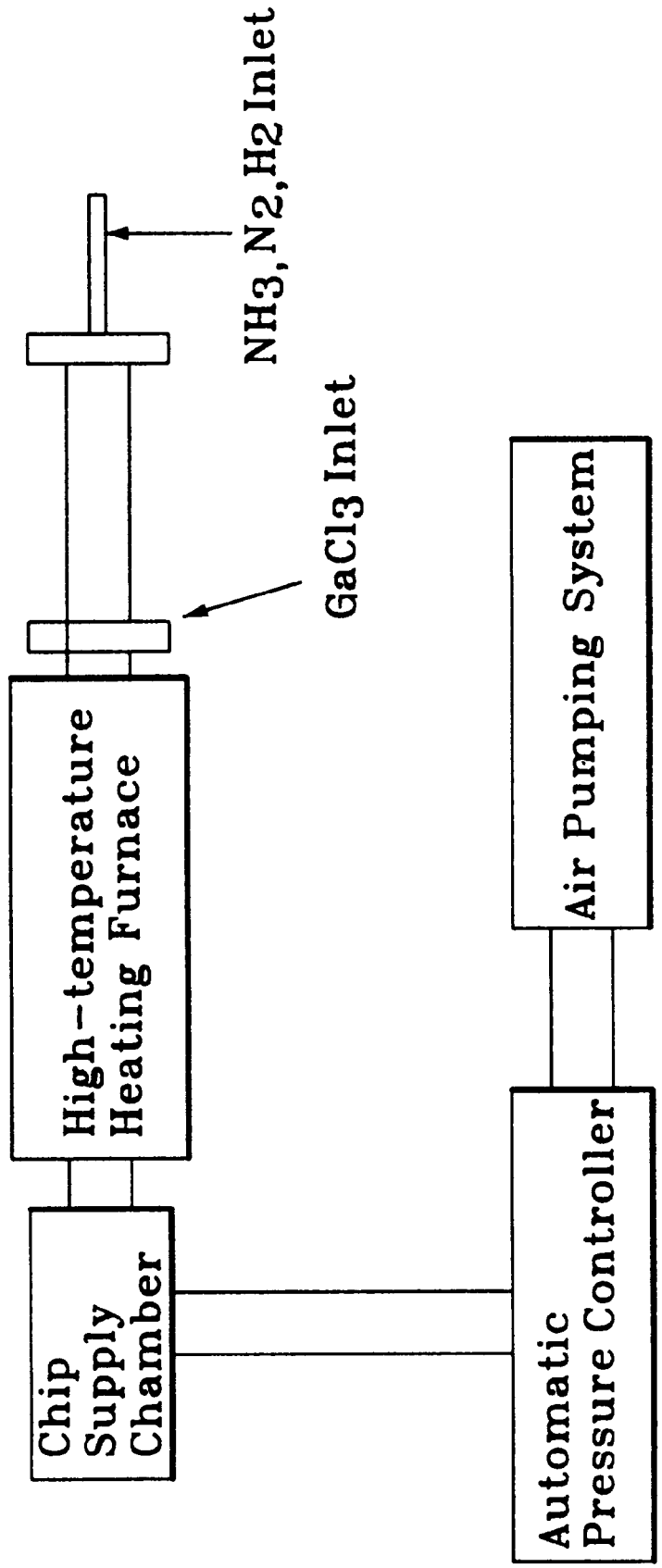
FIG. 1 is a brief chart showing a system according to an embodiment of the invention.

FIG. 1 illustrates a system used by an embodiment of the invention. In this embodiment, gallium-containing gallium trichloride ($GaCl_3$) is directly reacted with ammonia ($NH_3$) to form gallium nitride (GaN). The reaction equation is given as follows:

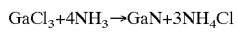

Since gallium trichloride ($GaCl_3$) is directly used to form gallium nitride (GaN), the formation of ammonium chloride ($NH_4Cl$) powder before forming gallium nitride (GaN) can be prevented, thereby ensuring the quality of a formed epitaxial layer.

Gallium trichloride ($GaCl_3$) at room temperature is a white solid. The growing process can be performed by heating the gallium trichloride ($GaCl_3$) up to about 90° C. and then using the vapor pressure thereof. In comparison with the prior art in which a vapor of gallium chloride (GaCl) must be formed at a temperature of over 800° C., it is obvious that the system design of the invention is more convenient and is more easily practiced.

In FIG. 1, since the gallium trichloride ($GaCl_3$) and ammonia ($NH_3$) are extremely reactive, the gallium trichloride ($GaCl_3$) and ammonia ($NH_3$) are separately sent to a reaction chamber. The two reactants are mixed with each other just before entering a high-temperature reaction region, thereby greatly reducing the formation of ammonium chloride ($NH_4Cl$). In this embodiment, the temperature of the high-temperature reaction region is about 300–1,400° C., preferably about 500–1,400° C. Furthermore, in this embodiment, before the gallium trichloride ($GaCl_3$) and ammonia ($NH_3$) reaction is in progress, a heat treatment can be first performed on the surface of the substrate by directing one of the gallium trichloride ($GaCl_3$) vapor and ammonia ($NH_3$) onto the substrate at a temperature of 500–1,400° C.

Gas flows of the embodiment for growing are described hereinafter:

N 200 sccm
$NH_4$ 200 sccm
$H_2$ 50 sccm
$GaCl_3$ 100 μmole/min.

Figure 2:
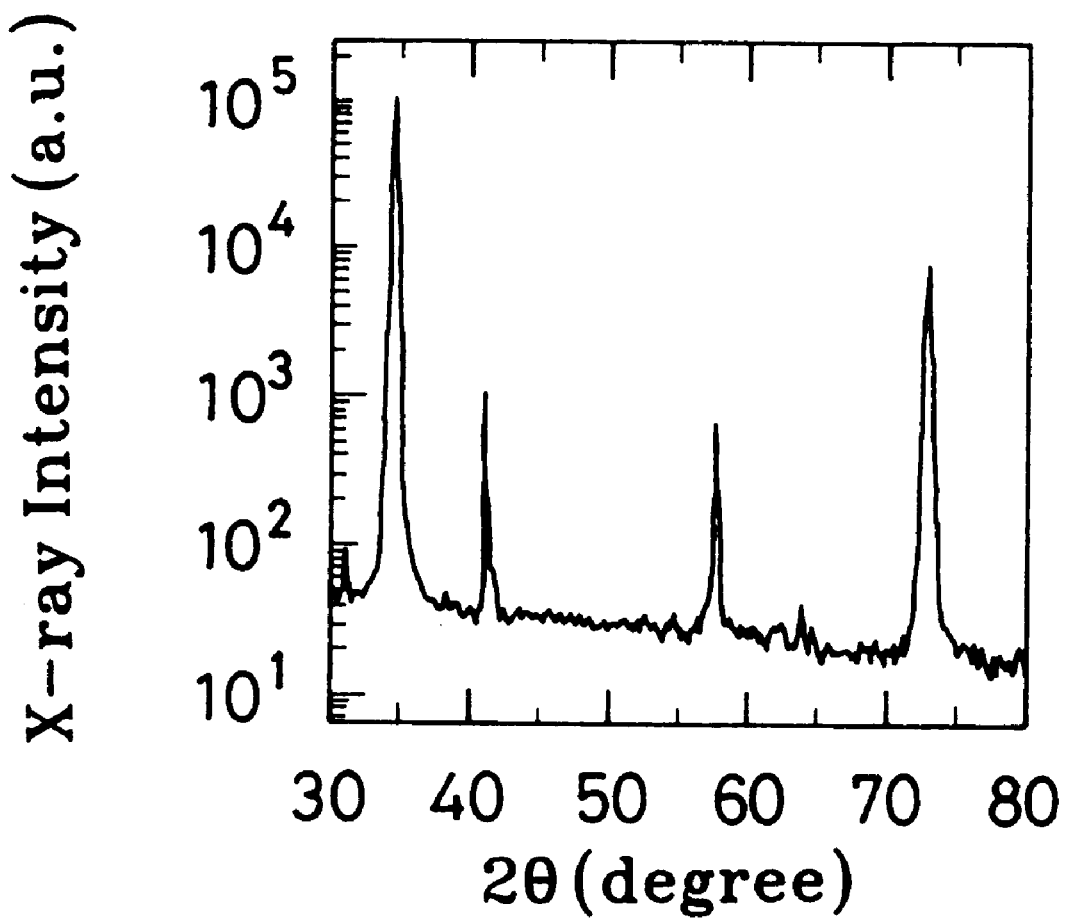
FIG. 2 is an X-ray diffraction spectrum graph of an embodiment according to the invention.
Figure 3A:
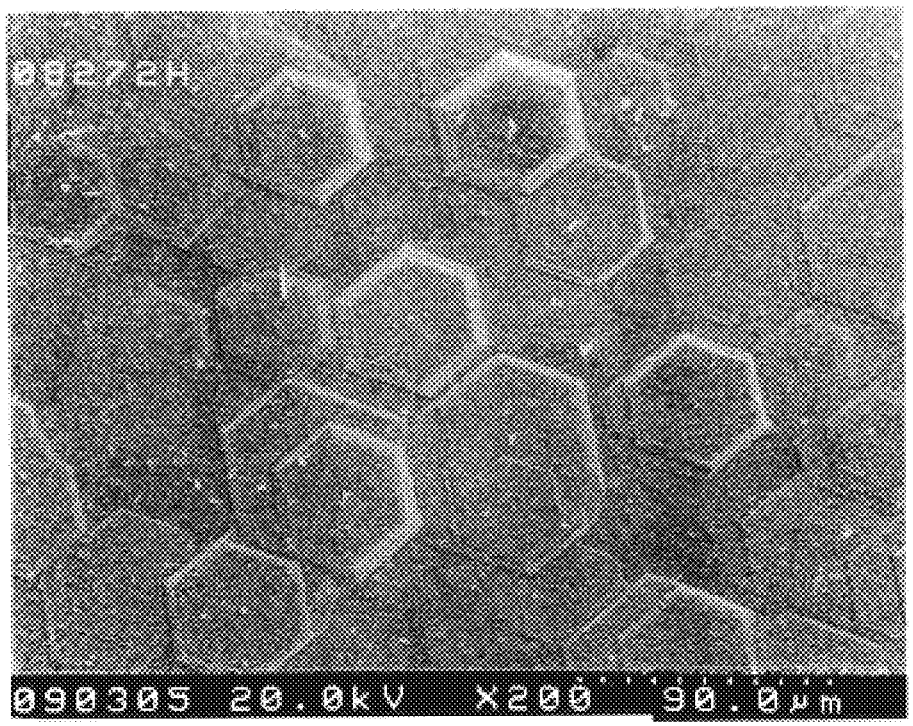
FIG. 3 is a photography taken by a scanning electronic microscope of an embodiment according to the invention.
Figure 3B:
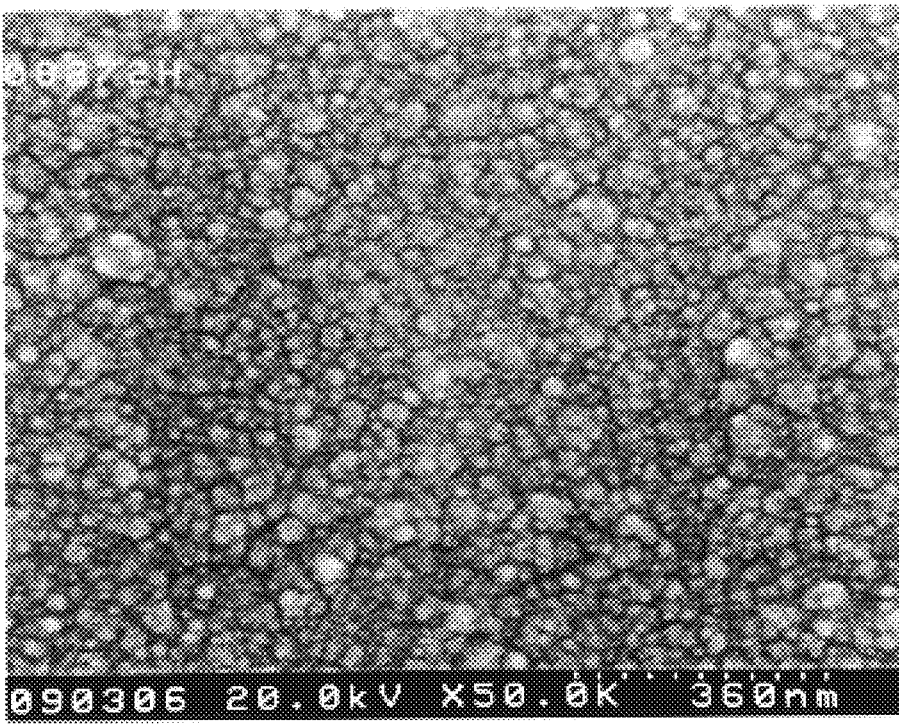

FIG. 2 is an X-ray diffraction spectrum graph of the embodiment. There exists an X-ray signal at an angle of 58 degree that represents the group of gallium nitride (GaN) [10.1] planes. FIG. 3, taken by a scanning electronic microscope, illustrates that there are hexagonal patterns on the surface of a gallium nitride (GaN) layer. The growing rate of the gallium nitride (GaN) layer, obtained by a cross-sectional thickness measuring with the scanning electronic microscope, is about 2.4 microns/hr.

Although the invention has been disclosed in terms of a preferred embodiment, the disclosure is not intended to limit the invention. Any modifications completed by those knowledgeable in the art according to the disclosure and teaching of the invention are within the scope and spirit of the invention.

What is claimed is:

1. A method for manufacturing an epitaxial wafer, suitable for forming a Group III metal nitride epitaxial layer on a substrate, comprising:

providing a substrate;

providing a first gas source, wherein said first gas contains an element of nitrogen;

providing a second gas, wherein said second gas contains a Group III metal trichloride with a carrier gas of $H_2$; and causing said first gas to react with said second gas in a heating region under an ambient containing $H_2$ gas, thereby forming Group III metal nitride on said substrate.

2. A method for manufacturing an epitaxial wafer as claimed in claim 1, wherein the material of said substrate can be one of sapphire ($Al_2O_3$), silicon carbide (SiC), silicon (Si), gallium arsenide (GaAs), gallium phosphide (GaP), gallium nitride (GaN) and aluminum gallium nitride (AlGaN).

3. A method for manufacturing an epitaxial wafer as claimed in claim 1, further comprising directing said first gas onto said substrate for performing a heat treatment on the surface of said substrate before reacting.

4. A method for manufacturing an epitaxial wafer as claimed in claim 1, further comprising directing said second gas onto said substrate for performing a heat treatment on the surface of said substrate before reacting.

5. A method for manufacturing an epitaxial wafer as claimed in claim 1, wherein said first gas is ammonia ($NH_3$).

6. A method for manufacturing an epitaxial wafer as claimed in claim 1, wherein said Group III metal nitride can be one of gallium nitride (GaN), aluminum nitride (AlN), indium nitride (InN) or a 3-element compound or a 4-element compound composed of the gallium nitride (GaN), aluminum nitride (AlN) and indium nitride (InN) in a specific proportion.

7. A method for manufacturing an epitaxial wafer as claimed in claim 1, wherein the temperature of said heating region is around 300–1,400° C.

8. A method for manufacturing an epitaxial wafer as claimed in claim 7, wherein the temperature of said heating region is around 500–1,400° C.

9. A method for manufacturing an epitaxial wafer as claimed in claims 3 or 4, wherein the temperature of said heat treatment is around 500–1,400° C.

10. A method for manufacturing an epitaxial wafer as claimed in claim 1, further comprising forming a buffer layer on said substrate before reacting.

11. A method for manufacturing an epitaxial wafer as claimed in claim 1, further comprising stripping off said substrate after forming said epitaxial layer.

12. A method for manufacturing an epitaxial wafer as claimed in claim 10, further comprising stripping off said substrate and said buffer layer after forming said epitaxial layer.

13. A method for manufacturing an epitaxial wafer as claimed in claim 4, wherein the temperature of said heat treatment is around 500–1,400° C.

14. A method for manufacturing an epitaxial wafer as claimed in claim 4, further comprising a step of directing said first gas onto said substrate for performing another heat treatment on the surface of said substrate after the step of directing said second gas onto said substrate for performing a heat treatment step on the surface of said substrate is performed.

15. A method for manufacturing an epitaxial wafer, suitable for forming a Group III metal nitride epitaxial layer on a substrate, comprising:

providing a substrate;

providing a first gas source, wherein said first gas contains an element of nitrogen;

providing a second gas, wherein said second gas contains a Group III metal trichloride;

directing said second gas onto said substrate for performing a heat treatment step on the surface of said substrate; and causing said first gas to react with said second gas in a heating region, thereby forming Group III metal nitride on said substrate.

16. A method for manufacturing an epitaxial wafer, suitable for forming a Group III metal nitride epitaxial layer on a substrate, comprising:

providing a substrate;

providing a first gas source, wherein said first gas contains an element of nitrogen;

providing a second gas, wherein said second gas contains a Group III metal trichloride;

forming a buffer layer on said substrate; and causing said first gas to react with said second gas in a heating region, thereby forming Group III metal nitride on said substrate.

17. A method for manufacturing an epitaxial wafer, suitable for forming a Group III metal nitride epitaxial layer on a substrate, comprising:

providing a substrate;

providing a first gas source, wherein said first gas contains an element of nitrogen;

providing a second gas, wherein said second gas contains a Group III metal trichloride;

causing said first gas to react with said second gas in a heating region, thereby forming Group III metal nitride on said substrate; and stripping off said substrate after forming said epitaxial layer.

18. A method for manufacturing an epitaxial wafer, suitable for forming a Group III metal nitride epitaxial layer on a substrate, comprising:

providing a substrate;

providing a first gas source, wherein said first gas contains an element of nitrogen;

providing a second gas, wherein said second gas contains a Group III metal trichloride;

forming a buffer layer on said substrate;

causing said first gas to react with said second gas in a heating region, thereby forming Group III metal nitride on said substrate; and stripping off said substrate and said buffer layer after forming said epitaxial layer.

19. A method for manufacturing an epitaxial wafer, suitable for forming a Group III metal nitride epitaxial layer on a substrate, comprising:

providing a substrate;

providing a first gas source, wherein said first gas contains an element of nitrogen;

providing a second gas, wherein said second gas contains a Group III metal trichloride;

directing said second gas onto said substrate for performing a heat treatment step on the surface of said substrate, wherein the temperature of said heat treatment step is around 500–1400° C.; and causing said first gas to react with said second gas in a heating region, thereby forming Group III metal nitride on said substrate.

* * * * *